(12) United States Patent
Hemmert et al.

(10) Patent No.: US 6,717,437 B2
(45) Date of Patent: Apr. 6, 2004

(54) SEMICONDUCTOR MODULE

(75) Inventors: Heinrich Hemmert, München (DE); Robert Kaiser, Kaufering (DE); Florian Schamberger, Bad Reichenhall (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/103,373

(22) Filed: Mar. 21, 2002

(65) Prior Publication Data

US 2002/0135411 A1 Sep. 26, 2002

(30) Foreign Application Priority Data

Mar. 21, 2001 (DE) .......................... 101 13 821

(51) Int. Cl.⁷ .................. H03K 19/173; H03K 3/289
(52) U.S. Cl. ............... 326/46; 326/29; 326/93; 327/202
(58) Field of Search ................. 326/46, 29, 62, 326/93, 113; 714/726; 327/202

(56) References Cited

U.S. PATENT DOCUMENTS

| | | | | |
|---|---|---|---|---|
| 4,495,629 A | * | 1/1985 | Zasio et al. | 377/70 |
| 5,949,258 A | | 9/1999 | Jeong | |
| 5,986,943 A | | 11/1999 | Isa | |
| 6,389,566 B1 | * | 5/2002 | Wagner et al. | 714/726 |

* cited by examiner

*Primary Examiner*—Daniel Chang
(74) *Attorney, Agent, or Firm*—Laurence A. Greenberg; Werner H. Stemer; Gregory L. Mayback

(57) ABSTRACT

The invention relates to a semiconductor module having a plurality of signal paths for carrying external signals that each contain a setup and hold circuit on the basis of a latch circuit with a full latch and a logic circuit. The latch circuit contains at a beginning of the signal path upstream of the logic circuit a hold latch. The hold latch responds to the leading edge of a fast clock signal derived from the clock signal of the external signal, for the early latching of the external signal and for the decoupling of the hold time from the setup time. The full latch is disposed downstream of the logic circuit for the final latching of the external signal or of a signal derived from the latter.

6 Claims, 2 Drawing Sheets

SEMICONDUCTOR MODULE

BACKGROUND OF THE INVENTION

Field of the Invention

The invention relates to a semiconductor module, e.g. a semiconductor module having a plurality of signal paths for carrying external signals which each contain a setup and hold circuit on the basis of a latch circuit with a full latch and a logic circuit.

Accordingly, the present invention lies in the field of setting the setup and hold circuit on the signal paths of a (symmetrical) semiconductor module. The setup and hold times should be set or centered in such a way that the semiconductor module ensures fast internal signal processing. For this purpose, two procedures or configurations of the setup and hold circuit of the semiconductor module have been known hitherto.

The first procedure provides the configuration of a full latch (circuit for complete latching of signals) near to the start of the signal path, i.e. near to an input to the latter. The configuration of the full latch allows the setup and hold times to be centered without difficulty since, at this point on the signal path, there are typically only a small number of signals present which, moreover, cover very similar path lengths up to the full latch. However, the external setup time of the signal (called an external signal in the present case) cannot be utilized for internal fast signal processing because the signals must wait for the clock of the full latch before the latch operation in the full latch.

A second procedure provides for a full latch in the setup and hold circuit of the semiconductor module at a point on the signal path which is located further downstream. In other words, the signals carried on the signal path are not latched until they have already passed through a considerable stretch of the signal path, which is typically characterized by a plurality of logic circuits (when mention is made of logic circuits in the singular in the present case, this is also intended to encompass a plurality of logic circuits). Since the clock signal path (clock path) to the full latch is shorter than the relatively long stretch of the signal path on which the external signal is carried, the clock signal can temporally catch up with the external signal on its stretch to the full latch, so that at the full latch (complete latching) the signals do not have to wait for the clock signal for a long time. This enables the external setup time of the signal to be utilized in favor of internal fast signal processing. However, since, in the course of the long stretch of the signal path up to the full latch, i.e. during the processing of the external signal by logic circuits, the originally few signals have been split into many sub-signals which, moreover, also pass through very different path lengths up to the full latch, the centering of the setup and hold times in this way is complicated and problematic.

The two previous procedures for centering the setup and hold times or the two previous latch contents are thus able to utilize only either the realization of problem-free setting of the setup and hold times or the utilization of the external setup time for fast internal signal processing.

U.S. Pat. No. 5,949,258 discloses a semiconductor module having two latch circuits that are disposed on a signal path and each perform a complete latch operation with the setting of the setup and hold times.

SUMMARY OF THE INVENTION

It is accordingly an object of the invention to provide a semiconductor module which overcomes the above-mentioned disadvantages of the prior art devices of this general type, which ensures fast internal signal processing by a suitable configuration of the setup and hold circuit.

With the foregoing and other objects in view there is provided, in accordance with the invention, a semiconductor module. The module contains a signal path for carrying external signals. The signal path includes a first latch circuit, at least one logic circuit connected downstream of the first latch, and a second latch circuit connected downstream of the logic circuit and functioning as a full latch. The first latch circuit and the second latch circuit set a setup time and a hold time of a fed-in external signal fed onto the signal path. The first latch circuit functions as a hold latch for transmitting a leading signal edge and for delaying a trailing signal edge of the fed-in external signal on a basis of a clock signal derived from a leading signal edge of an external signal clock signal of the fed-in external signal, in order to set an internal hold time for the fed-in external signal on the signal path before the fed-in external signal passes through the logic circuit.

Accordingly, in the case of the semiconductor module of the type mentioned in the introduction, the invention provides that the latch circuit contains at a beginning of the signal path upstream of the logic circuit a hold latch, which responds to the leading edge of a fast clock signal derived from the clock signal of the external signal, for the early latching of the external signal and for the decoupling of the hold time from the setup time. The full latch is disposed downstream of the logic circuit for the final latching of the external signal or of a signal derived from the latter.

In contrast to the two procedures according to the prior art as explained above, the setup and hold circuit of the semiconductor module according to the invention is accordingly provided with two latch circuits which are disposed at different points of the signal path and of which one is configured as a hold latch and the other as a full latch. The hold latch is disposed at the beginning of the signal path, while the full latch is disposed downstream of the latter, following a logic circuit or a plurality of logic circuits.

According to the invention, the task of the hold latch is to latch the incoming or external signal very early and to decouple the hold time from the setup time of the signal by the signal acquiring a dedicated internal hold time. The final latching of the (external) signal is effected after the latter has passed through the logic circuits, in the full latch.

The invention thereby makes it possible to utilize the advantages of the previous two procedures for centering the setup and hold times, without accepting their disadvantages. In other words, the configuration of the semiconductor module according to the invention makes it possible both to set the setup and hold times without difficulty and to utilize the external setup time in favor of fast internal signal processing.

In an advantageous manner, for changing over the hold latch between the states transparent and non-transparent, it is provided that the fast clock signal is applied to the clock terminal of the hold latch for the purpose of delaying the trailing edge of the external signal while providing an internal hold time—independent of the setup time—for this signal. In this case, the length of the fast clock signal, for providing an internal hold time, is preferably chosen in such a way as to ensure reliable latching of the full latch connected downstream. The fast clock signal thereby present at the hold latch enables the hold latch to be transparent when an external signal arrives. The leading edge, i.e. the setup edge, of the incoming signal can thereby pass through the hold latch, is latched and follows the further signal path unimpeded. In other words, the signal edge is not retained in the hold latch, but rather continues on its way on the signal path without any delay. Before the trailing signal edge or hold edge, can then pass through the hold latch, the fast clock signal switches the hold latch to a non-transparent state, as a result of which the signal downstream of the hold latch on the signal path maintains its level unimpeded. In other words, the trailing signal edge is temporally delayed by this measure. The duration or width of the blocking clock pulse determines a minimum width of the signal pulse downstream of the hold latch on the signal path. The consequence of this is that an internal hold time of the internal signal is generated which is independent of the setup time.

In order to ensure that, in the case of a plurality of external signals carried separately on the signal path, the signals can be processed simultaneously in the hold latch, a delay circuit is preferably connected upstream of the hold latch. A further delay circuit is preferably connected upstream of the clock input of the full latch. Both delay circuits are provided for adapting the phase angles of the external signals.

A configuration of the hold latch that is advantageous because it is simple provides, in a sequence from its input to its output, a p/n-channel element (for example in the form of a transmission gate, a transfer gate or a pass gate) and two reverse-connected parallel inverters. With the same aim, the full latch provides a series circuit of two identical circuits which each have the internal construction of the hold latch.

Other features which are considered as characteristic for the invention are set forth in the appended claims.

Although the invention is illustrated and described herein as embodied in a semiconductor module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
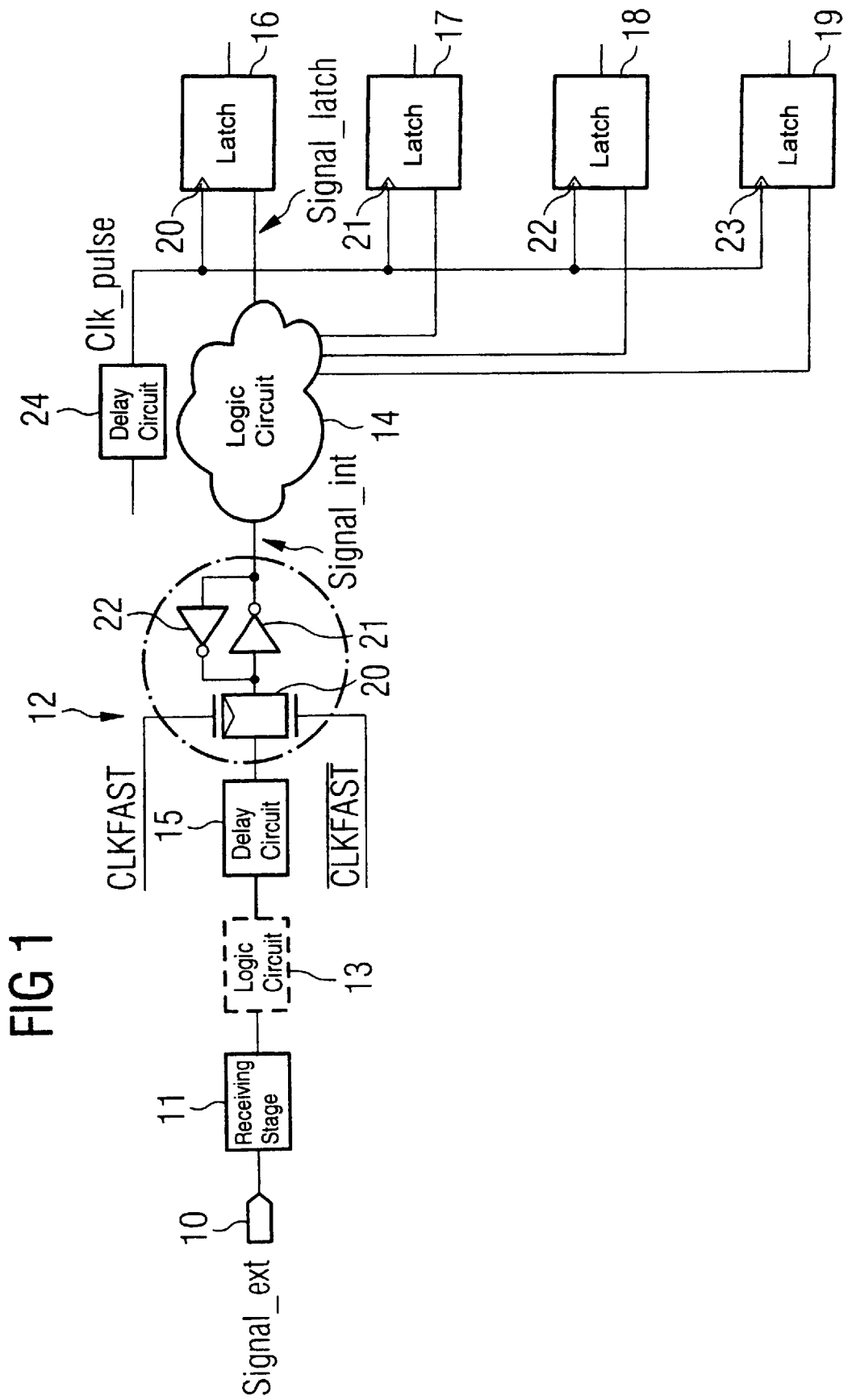
FIG. 1 is a block diagram showing a detail of a signal path of a semiconductor memory module configured with a setup and hold circuit configured according to the invention.

Referring now to the figures of the drawing in detail and first, particularly, to FIG. 1 thereof, there is shown a detail of a signal path for carrying external signals of a semiconductor memory module. What is shown is a section of the signal path proceeding from a beginning 10 of the signal path, at which an external signal Signal_ext is fed in. The beginning 10 of the signal path is followed by a first circuit in the form of a receiving stage 11. A hold latch 12 is disposed in the signal path preferably directly after the receiving stage 11. In an optional manner and as shown by broken lines in FIG. 1, the receiving stage 11 is already followed by a first logic circuit 13 of typically a plurality of logic circuits that are present on the signal path, such as a logic circuit 14, which follows downstream of the hold latch 12.

In the embodiment shown in FIG. 1, a delay circuit 15 is connected directly upstream of the hold latch 12, which delay circuit is discussed in more detail below.

At the, for example, four outputs of the logic circuit 14, four full latches 16 to 19 are connected downstream, whose clock pulse inputs 20 to 23 are connected to one another and to a delay circuit 24.

Figure 3:
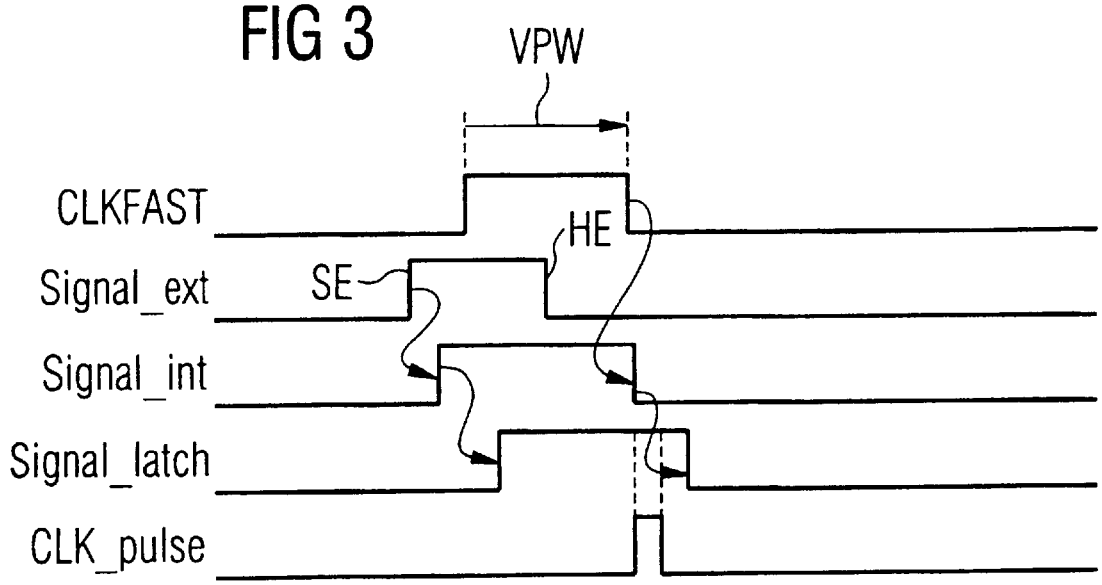
FIG. 3 is a timing diagram of the signals in FIG. 1.

The signal leaving the hold latch 12 is designated by signal_int in FIG. 1. The signal leaving the logic circuit 14 is designated by Signal_latch in FIG. 1. A clock signal for the hold latch 12 is designated by CLKFAST and $\overline{\text{CLKFAST}}$ in FIG. 1. While a common clock signal for the full latches 16 to 19 is designated by CLK_pulse. The profile of the signals with respect to one another is shown in FIG. 3. In FIG. 3, a variable pulse width of the hold latch 12 of FIG. 1 is designated by VPW (VPW stands for Variable Pulse Width). The rising edge, the leading edge, or the setup edge of the signals Signal_ext, Signal_int and Signal_latch is designated by SE (SE stands for setup edge), while the trailing edge, falling edge, or hold edge of these signals is designated by HE (HE stands for hold edge). The setup and hold times of the external signal Signal_ext are adjusted or centered in accordance with FIG. 1 as follows.

The hold latch 12 is driven with the fast clock signal CLKFAST derived from a clock signal of the external signal Signal_ext. The clock signal CLKFAST changes over the hold latch 12 between the states transparent and non-transparent, as shown in detail in FIG. 3. The leading edge or setup edge SE of the external signal Signal_ext passes through the hold latch 12, is latched therein and then passes through the further signal path downstream of the hold latch 12 unimpeded. In other words, the signal edge SE is not retained in the hold latch 12, but rather continues on its way on the signal path without any delay. In this connection, an essential difference between the hold latch 12 and the full latch 16 to 19 becomes clear. At the hold latch, unlike at the full latch, the leading signal edge SE does not have to wait for the fast clock signal CLKFAST.

Before the trailing signal edge or hold edge HE can pass through the hold latch 12, the fast clock signal CLKFAST changes over the hold latch 12 to the non-transparent state. As long as the fast clock signal CLKFAST remains in this state, the level of the signal Signal_int downstream of the hold latch remains unchanged. In other words, the hold edge HE of the external signal Signal_ext is temporally delayed by the hold latch 12, so that the width of the blocking clock pulse CLKFAST determines a minimum width of the signal pulse of the signal Signal_int downstream of the hold latch 12. In other words, an internal hold time is generated in this way for the external signal Signal_ext, which hold time is independent of the setup time.

The pulse width of the fast clock signal CLKFAST is adjusted in such a way that, for all the signals of the downstream full latches 16 to 19, an internal hold time is set which ensures reliable latching of the signal (full-signal_latch) with the respective full latch 16 to 19. The temporal setting of the trailing signal edge HE does not result in a disadvantageous effect on the processing speed on the signal path.

In order that, when a plurality of external signals are applied to the signal path, it is ensured that the signals fall within the variable pulse width VPW of the hold latch 12 in the sense explained above, the delay circuit 15 is provided, whose delay is adjustable for the individual external signals.

In the same sense, the clock signal CLK_pulse for the full latches 16 to 19 can likewise be adjusted by suitable trimming elements, namely by the delay circuit 24. However, the edge modification of the external signals by the hold latch 12 results in that, unlike in the case of the hold latch 12, the clock signal CLK_pulse need not be individually matched for each individual full latch 16, 17, 18 and 19. It suffices, rather, for the clock signal CLK_pulse to be adjusted or set to the, in this sense, worst-case signal from a group of associated signals. This results in that a single clock signal adjustment suffices for all of the full latches 16 to 19, which greatly simplifies the adjustment of the signals.

A preferred construction of the hold latch 12 is revealed in FIG. 1. Accordingly, the hold latch 12 contains, in a sequence from its input to its output, a p/n-channel element 20 and two reverse-connected parallel inverters 21 and 22.

Figure 2:
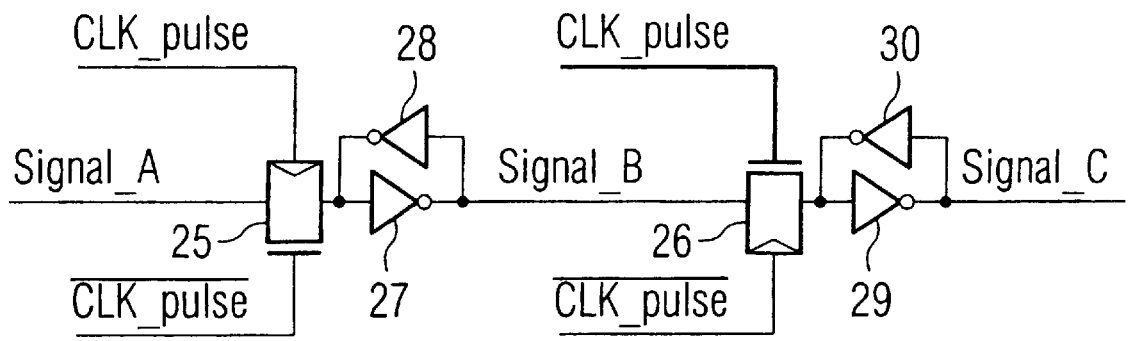
FIG. 2 is a circuit diagram of an embodiment of one of four full latches of FIG. 1.
Figure 4:
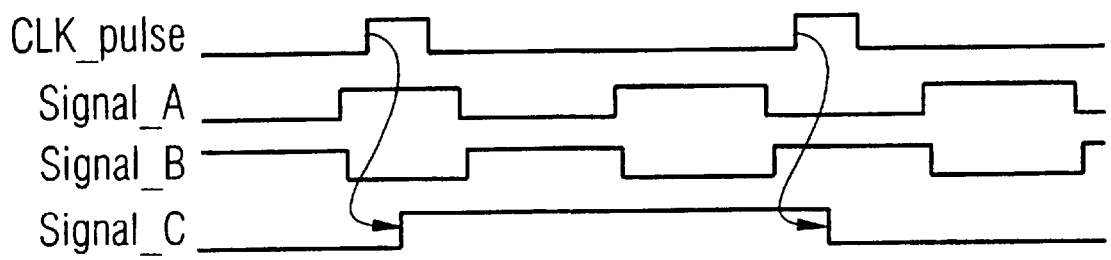
FIG. 4 is a timing diagram of the signals in FIG. 2.

A preferred embodiment of the full latch 16, 17, 18 or 19 (all of the full latches 16 to 19 are configured identically) is revealed in FIG. 2, while the signal profile of the full latches is revealed in FIG. 4. Accordingly, the full latch shown in FIG. 2 contains a series circuit of two identical circuits each containing, in a sequence from their input to their output, a p/n-channel element 25, 26 and two reverse-connected parallel inverters 27, 28 and 29, 30, respectively.

The clock signals CLK_pulse and/CLK_pulse is in each case applied to the two p/n-channel elements 25 and 26. The output signal Signal_latch of the logic circuit 14, which is fed to the first circuit 25, 27, 28, is designated by Signal_A in FIG. 2. An output signal of the first circuit, which forms the input signal of the subsequent circuit, is designated by Signal_B and an output signal of the second circuit or of the full latch is designated by Signal_C, and FIG. 4 reveals that this signal represents a completely latched signal.

To summarize, the following is to be emphasized with regard to the function of the setup and hold circuit shown in FIG. 1. The positioning of the hold latch 12 near to the beginning 10 of the signal path ensures simple and uncomplicated optimization of the setup and hold times of the signal Signal_ext carried on the signal path. Since the hold latch sets the timing control of the trailing signal edge HE, reliable latching by the downstream full latch 16 to 19 is ensured without any losses primarily with regard to the signal processing speed. It is particularly advantageous in this case that the timing control of the full latch 16 to 19 is possible by a single clock signal adjustment. Moreover, the hold latch 12 allows the leading signal edge SE to pass unimpeded and essentially without any delay, so that the external setup time can be utilized for improving the internal signal processing speed.

We claim:

1. A semiconductor module, comprising:
    a signal path for carrying external signals, said signal path including:
    a first latch circuit;
    at least one logic circuit connected downstream of said first latch; and
    a second latch circuit connected downstream of said logic circuit and functioning as a full latch, said first latch circuit and said second latch circuit setting a setup time and a hold time of a fed-in external signal fed onto said signal path;
    said first latch circuit functioning as a hold latch for transmitting a leading signal edge and for delaying a trailing signal edge of the fed-in external signal on a basis of a clock signal derived from a leading signal edge of an external signal clock signal of the fed-in external signal, in order to set an internal hold time for the fed-in external signal on said signal path before the fed-in external signal passes through said logic circuit.

2. The semiconductor module according to claim 1, wherein the clock signal has a length for defining the internal hold time, and is chosen in such a way as to enable said second latch circuit to effect reliable setting of the setup time and the hold time of the fed-in external signal that has passed through said logic circuit.

3. The semiconductor module according to claim 1,
    wherein said signal path carries a plurality of the external signals; and
    further comprising a delay circuit connected upstream of said first latch circuit, said delay circuit adapting phase angles of the plurality of the external signals.

4. The semiconductor module according to claim 3,
    wherein said second latch circuit has a clock terminal; and
    further comprising a further delay circuit connected to said clock terminal of said second latch circuit, said further delay circuit adapting the phase angles of the plurality of the external signals which have passed through said first latch circuit and said logic circuit.

5. The semiconductor module according to claim 1, wherein said first latch circuit has an input, a p-/n-channel element connected to said input, two reverse connected parallel inverters connected to said p-/n-channel element, and an output connected to said two reverse-connected parallel inverters.

6. The semiconductor module according to claim 1, wherein said second latch circuit has a series circuit of two identical circuit units each containing an input, a p-/n-channel element connected to said input, two reverse-connected parallel inverters connected to said p-/n-channel element, and an output connected to said two reverse-connected parallel inverters.

* * * * *